United States Patent [19]

Tanaka

[11] Patent Number: 5,751,036
[45] Date of Patent: May 12, 1998

[54] FLOATING GATE TYPE NON-VOLATILE SEMICONDUCTOR MEMORY DEVICE

[75] Inventor: Akira Tanaka, Kanagawa, Japan

[73] Assignee: Sony Corporation, Japan

[21] Appl. No.: 651,784

[22] Filed: May 24, 1996

[30] Foreign Application Priority Data

Jun. 2, 1995 [JP] Japan ................. 7-159988

[51] Int. Cl.⁶ .................. H01L 29/76; H01L 29/788
[52] U.S. Cl. .................. 257/315; 257/314; 257/317; 257/320; 257/326
[58] Field of Search .................. 257/314–326

[56] References Cited

U.S. PATENT DOCUMENTS 5,138,410  8/1992  Takebuchi ................. 257/321
5,273,923  12/1993  Chang et al. ................. 251/314

*Primary Examiner*—Tom Thomas
*Assistant Examiner*—Fetsum Abraham
*Attorney, Agent, or Firm*—Ronald P. Kananen

[57] ABSTRACT

A tunnel region is surrounded by an impurity diffusion layer and a drain diffusion layer, and a coupling portion coupling one and the other end portions of a floating gate to each other is arranged on only an isolation region. With this arrangement, even if a parasitic inversion layer is formed below the other end portion upon extraction of electrons, the parasitic inversion layer does not contact a semiconductor substrate, resulting in a small substrate current. Therefore, a high-voltage, large-current external power supply need not be prepared in addition to a normal voltage power supply.

8 Claims, 5 Drawing Sheets

FLOATING GATE TYPE NON-VOLATILE SEMICONDUCTOR MEMORY DEVICE

BACKGROUND OF THE INVENTION

1. Field of the Invention

The present invention relates to a floating gate type non-volatile semiconductor memory device in which data is rewritten by injecting or extracting carriers into or from a floating gate.

2. Description of the Related Art

FIGS. 1A to 1C show an N-channel type flash EEPROM according to a related art. In this related art, an $SiO_2$ film 12 is formed on the surface of an isolation region of a P-type Si substrate 11, and an $SiO_2$ film 13 is formed as a gate oxide film on the surface of an active region surrounded by the $SiO_2$ film 12. A polysilicon film 14 on the $SiO_2$ films 13 and 12 forms a floating gate which is isolated for every memory cell.

An $SiO_2$ film 15 on the polysilicon film 14 forms a capacitor coupling insulating film, and a polysilicon film 16 on the $SiO_2$ films 15 and 12 forms a control gate for continuous memory cells in the row direction. N-type source and drain diffusion layers 17s and 17d are formed in the active region on both the sides of the polysilicon films 14 and 16. The active region below the polysilicon films 14 and 16 serves as a channel region 18.

An overlapping portion between the drain diffusion layer 17d and the polysilicon film 14 serves as a tunnel region 22 for flowing a tunnel current 21 through the $SiO_2$ film 13 at this portion. A contact hole 23 for a bit line (not shown) is formed in an interlayer insulator (not shown) covering the entire surface on the Si substrate 11, and the like, and reaches the drain diffusion layer 17d.

In this related art, when electrons are to be extracted from the polysilicon film 14 serving as the floating gate to the drain diffusion layer 17d so as to rewrite data, a high voltage of about 15 to 20 V with respect to the polysilicon film 16 serving as the control gate is applied to the drain diffusion layer 17d, and a high electric field of 10 MV/cm or more is applied to the $SiO_2$ film 13 to generate the tunnel current 21 in the $SiO_2$ film 13 in the tunnel region 22. Note that electrons may also be extracted to the source diffusion layer 17s.

When a voltage as high as about 15 to 20 V with respect to the polysilicon film 16 is applied to the drain diffusion layer 17d, however, as shown in FIG. 1C, a depletion layer 25 is formed on both the sides of a junction 24 between the drain diffusion layer 17d and the Si substrate 11 and near the boundary between the drain diffusion layer 17d and the polysilicon film 14, i.e., near the tunnel region 22. At the same time, a P-type parasitic inversion layer 26 is formed from the tunnel region 22 to the channel region 18 in contact with the Si substrate 11.

On the other hand, band to band transition very easily occurs in the tunnel region 22 upon application of the above-described high voltage to generate a large number of electron-hole pairs. The generated electrons flow into the drain diffusion layer 17d due to an electric field in the depletion layer 25, while the holes flow into the Si substrate 11 through the parasitic inversion layer 26.

As a result, a band to band current as large as about 0.1 to 1 μA flows between the drain diffusion layer 17d and the Si substrate 11 and is measured as a substrate current. Therefore, in the related art shown in FIGS. 1A to 1C, a high-voltage, large-current power supply is required in addition to a normal voltage power supply, resulting in a complicated arrangement.

In a method employed to suppress the above-described band to band current, the impurity concentration of the drain diffusion layer 17d is set not so high. By this method, however, not only the band to band current but also an electron flow from the polysilicon film 14 to the drain diffusion layer 17d are suppressed, resulting in an increase in data rewrite time and a rewrite error.

SUMMARY OF THE INVENTION

According to the invention of the present application, a floating gate type non-volatile semiconductor memory device is characterized in that a tunnel region in which carriers are extracted from a floating gate through a gate insulating film is covered with at least one of an impurity diffusion layer electrically connected to either one of a drain diffusion layer and a source diffusion layer, and the drain diffusion layer or the source diffusion layer, and portions, on the tunnel region and a channel region, of the floating gate are connected to each other through only a portion on an isolation region.

With this arrangement, even if a parasitic inversion layer of the same conductivity type as that of a semiconductor substrate is formed in and near the tunnel region upon extraction of carriers from the floating gate through the gate insulating film, the parasitic inversion layer does not contact the semiconductor substrate because it is covered with a diffusion layer of a conductivity type opposite to that of the semiconductor substrate.

Even if, therefore, band to band transition occurs in the tunnel region to generate electron-hole pairs, only one kind of the electron-hole pairs flow into one of the drain and source diffusion layers, and the other kind thereof accumulates in the parasitic inversion layer and does not flow into the semiconductor substrate.

According to the invention of the present application, the impurity diffusion layer is preferably arranged in a region except for a carrier path used in a read access of stored data.

With this arrangement, the resistance of the impurity diffusion layer covering the tunnel region does not become a resistance in a data read access.

A preferred embodiment of the invention of the present application is characterized in that the impurity diffusion layer is formed in the same step for the drain or source diffusion layer electrically connected thereto.

With this arrangement, the diffusion layer covering the tunnel region is formed at the same time when an impurity is doped so as to form the source and drain diffusion layers. A manufacturing step of forming the diffusion layer need not be added.

Another preferred embodiment of the invention of the present application is characterized in that the tunnel region is surrounded by the isolation region from three directions.

With this arrangement, the area, etched in patterning the floating gate, of an active region near the tunnel region is smaller than that in, e.g., a structure in which the tunnel region is surrounded by the isolation region from only two directions. For this reason, the semiconductor substrate in the tunnel region has high crystallinity, and the junction leakage current and the like are small.

BRIEF DESCRIPTION OF THE DRAWINGS

FIGS. 1A to 1C show an N-channel type flash EEPROM according to a related art of the invention of the present application, in which FIG. 1A is a plan view, FIG. 1B is an enlarged sectional side view at a position taken along a line B—B in FIG. 1A, and FIG. 1C is an enlarged sectional side view showing a portion C in FIG. 1B;

FIGS. 2A and 2B show an N-channel type flash EEPROM according to the first embodiment of the invention of the present application, in which FIG. 2A is a plan view, and FIG. 2B is an enlarged sectional side view at a position taken along a line B—B in FIG. 2A;

FIGS. 3A and 3B show an N-channel type flash EEPROM according to the second embodiment of the invention of the present application, in which FIG. 3A is a plan view, and FIG. 3B is an enlarged sectional side view at a position taken along a line B—B in FIG. 3A;

FIGS. 4A and 4B show an N-channel type flash EEPROM according to the third embodiment of the invention of the present application, in which FIG. 4A is a plan view, and FIG. 4B is an enlarged sectional side view at a position taken along a line B—B in FIG. 4A; and FIGS. 5A and 5B show an N-channel type flash EEPROM according to the fourth embodiment of the invention of the present application, in which FIG. 5A is a plan view, and FIG. 5B is an enlarged sectional side view at a position taken along a line B—B in FIG. 5A.

DETAILED DESCRIPTION OF THE PREFERRED EMBODIMENTS

Figure 1A:
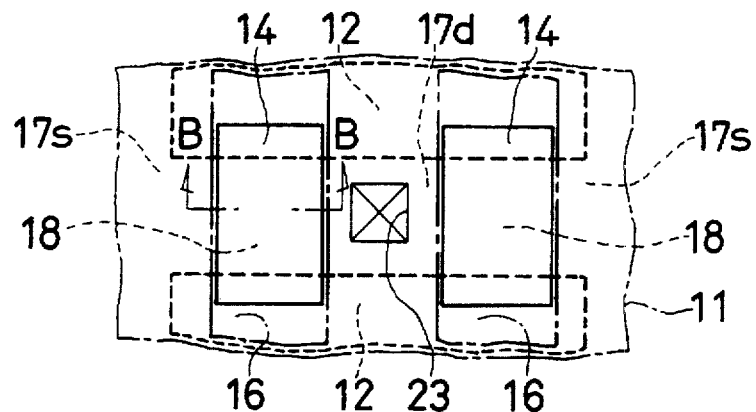
Figure 1B:
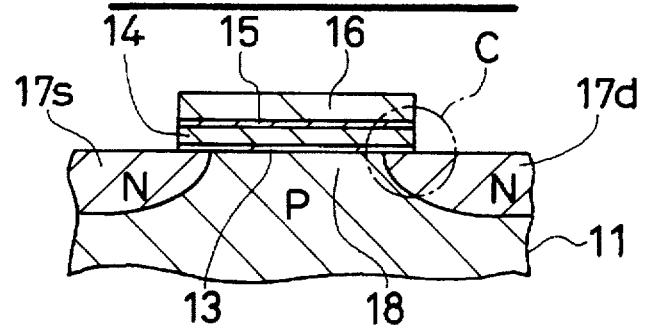
Figure 1C:
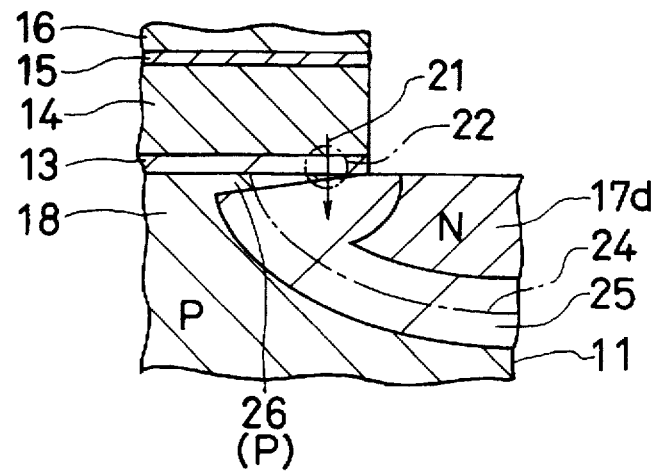
Figure 2A:
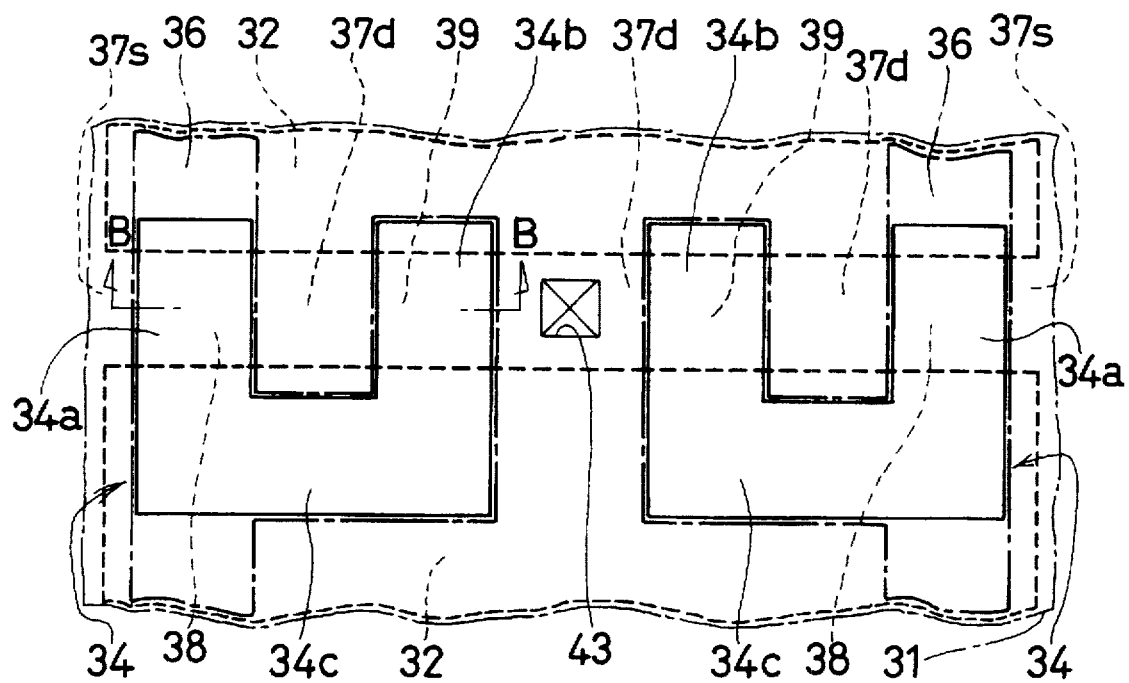
Figure 2B:
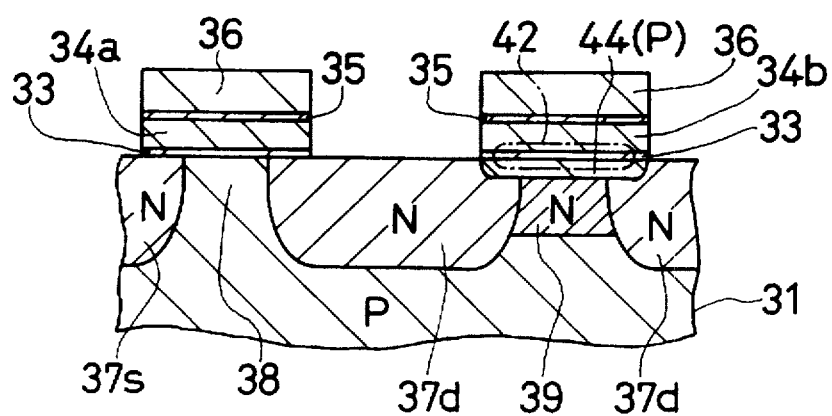

The first to fourth embodiments of the invention of the present application applied to an N-channel type flash EEPROM will be described below with reference to FIGS. 2 to 5. FIGS. 2A and 2B show the first embodiment. In the first embodiment, an $SiO_2$ film 32 is formed on the surface of an isolation region of a P-type Si substrate 31, and an $SiO_2$ film 33 is formed as a gate oxide film on the surface of an active region surrounded by the $SiO_2$ film 32.

A polysilicon film 34 on the $SiO_2$ films 33 and 32, having end portions 34a and 34b and a coupling portion 34c, forms a floating gate which is isolated for every memory cell. The polysilicon film 34 has a U shape as a whole. One and the other end portions 34a and 34b of the polysilicon film 34 cross the active region, and a coupling portion 34c coupling one and the other end portions 34a and 34b to each other is arranged on only the $SiO_2$ film 32.

An $SiO_2$ film 35 on the polysilicon film 34 forms a capacitor coupling insulating film, and a polysilicon film 36 on the $SiO_2$ films 35 and 32 forms a control gate for continuous memory cells in the row direction. N-type source and drain diffusion layers 37s and 37d are formed in the active region on both the sides of the polysilicon films 34 and 36. The active region below the one end portion 34a serves as a channel region 38.

An N-type impurity diffusion layer 39 is buried in the active region below the other end portion 34b, and the overlapping portion of the other end portion 34b with the drain diffusion layer 37d and the impurity diffusion layer 39 serves as a tunnel region 42. A contact hole 43 for a bit line (not shown) is formed in an interlayer insulator (not shown) covering the entire surface on the Si substrate 31, and the like, and reaches the drain diffusion layer 37d.

In the first embodiment, when electrons are to be extracted from the polysilicon film 34 to the drain diffusion layer 37d so as to rewrite data, even if a P-type parasitic inversion layer 44 is formed below the other end portion 34b of the polysilicon film 34, as shown in FIG. 2B, the parasitic inversion layer 44 does not contact the Si substrate 31 below the parasitic inversion layer 44 owing to the presence of the N-type impurity diffusion layer 39 formed below the parasitic inversion layer 44.

In addition, the N-type drain diffusion layer 37d is formed on both the sides of the parasitic inversion layer 44, and the polysilicon films 34 and 36 are not formed on the active region between one and the other end portions 34a and 34b of the polysilicon film 34. Thus, the parasitic inversion layer 44 is not present between one and the other end portions 34a and 34b, and the parasitic inversion layer 44 below the other end portion 34b does not contact the channel region 38 below the one end portion 34a. Therefore, the parasitic inversion layer 44 does not contact any portion of the Si substrate 31.

Accordingly, even if band to band transition occurs in the tunnel region 42 to generate electron-hole pairs, only the electrons of the electron-holes pairs flow into the drain diffusion layer 37d, and the holes accumulate in the parasitic inversion layer 44 and do not flow into the Si substrate 31.

Figure 3A:
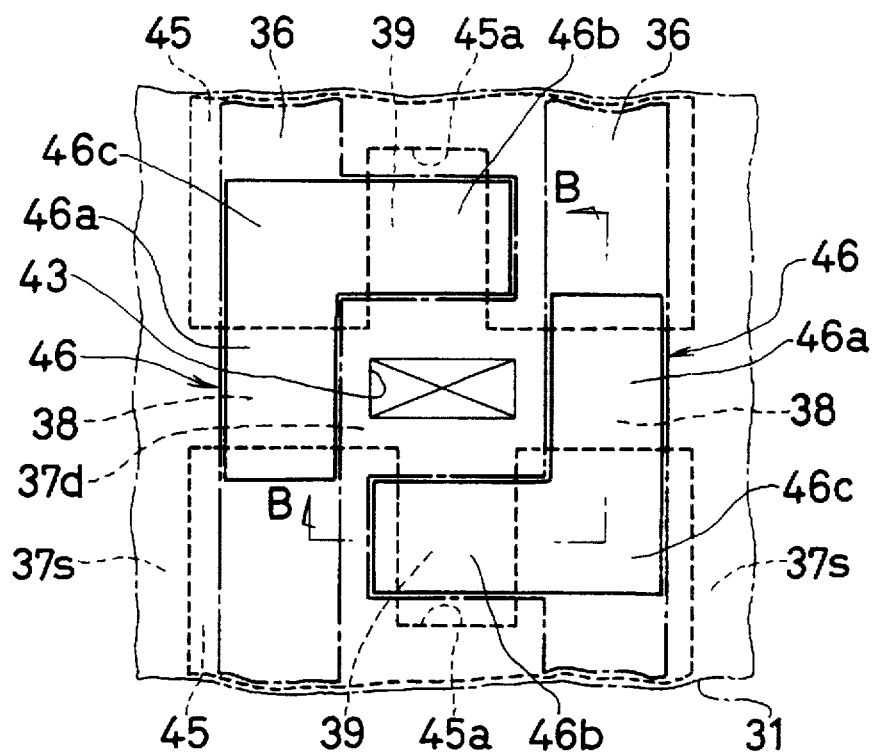
Figure 3B:
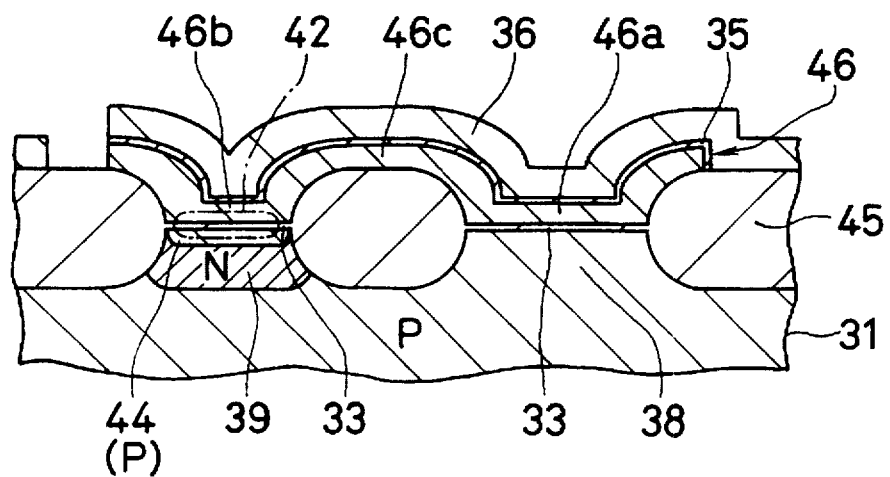

FIGS. 3A and 3B show the second embodiment. In the second embodiment, a rectangular notched portion 45a extending from the vicinity of a contact hole 43 in the extending direction of a polysilicon film 36 is formed in an $SiO_2$ film 45 forming an isolation region. The inside of the notched portion 45a also serves as an active region.

A polysilicon film 46 serving as a floating gate has an L shape as a whole. One and the other end portions 46a and 46b thereof cross the active region, and a corner portion 46c coupling one and the other end portions 46a and 46b to each other is arranged on only the $SiO_2$ film 45.

The active region below one end portion 46a serves as a channel region 38. An N-type impurity diffusion layer 39 is buried in the active region below the other end portion 46b, and the overlapping portion of the other end portion 46b with a drain diffusion layer 37d and the impurity diffusion layer 39 serves as a tunnel region 42. Remaining portions in the second embodiment have substantially the same arrangement as in the above-described first embodiment.

In the above-described first embodiment, since the impurity diffusion layer 39 is arranged between the channel region 38 and the contact hole 43, i.e., on an electron path used in a read access of stored data, as is apparent from FIGS. 2A and 2B, the resistance of the impurity diffusion layer 39 is added to a resistance involved in the data read access, resulting in a decrease in read speed.

In the second embodiment, however, since the impurity diffusion layer 39 is arranged in a region except for the electron path used in a read access of stored data, as is apparent from FIG. 3A, the resistance of the impurity diffusion layer 39 is not added to a resistance involved in the data read access, preventing a decrease in read speed.

Figure 4A:
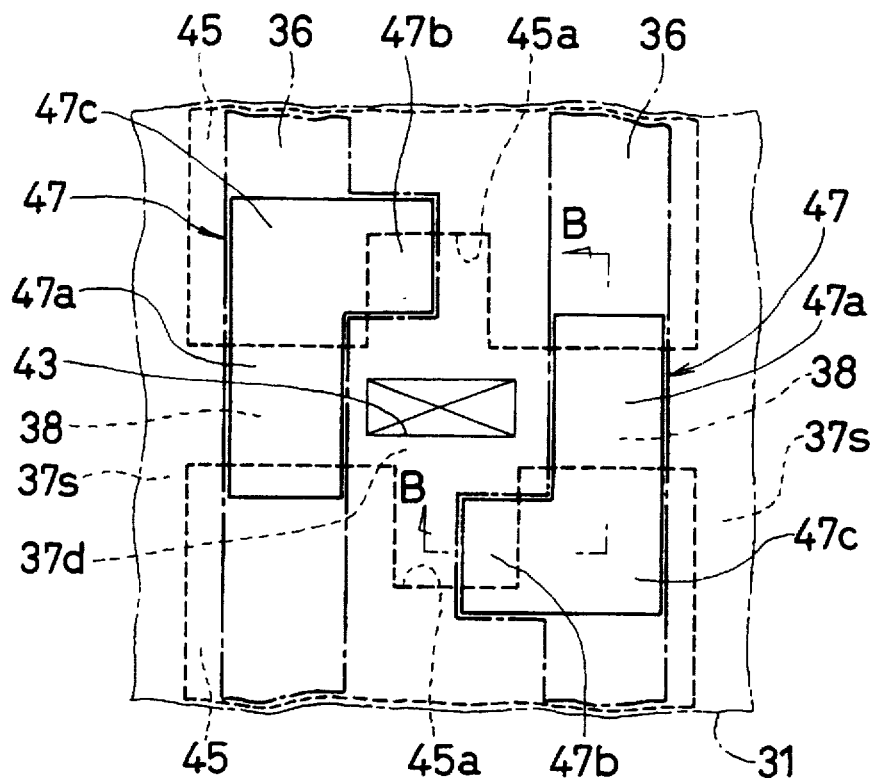
Figure 4B:
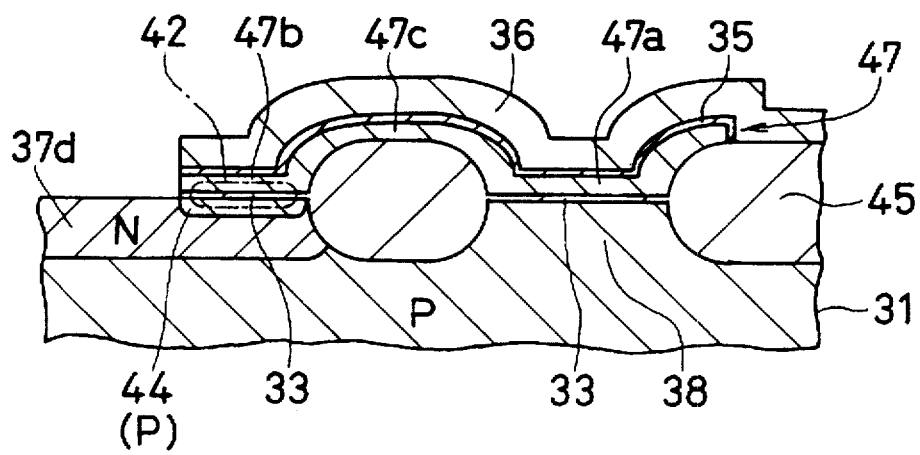

FIGS. 4A and 4B show the third embodiment. Also in the third embodiment, a polysilicon film 47 serving as a floating gate has an L shape as a whole. One end portion 47a of the polysilicon film 47 crosses an active region, and a corner portion 47c is arranged on only an $SiO_2$ film 45.

In the third embodiment, the other end portion 47b of the polysilicon film 47 slightly projects from the $SiO_2$ film 45 onto the active region, and its projection size is a size that allows diffusion of an impurity from a portion below the end edge of the other end portion 47b to a portion below the other end portion 47b when the impurity is doped to form source and drain diffusion layers 37s and 37d.

In the above-described first and second embodiments, the tunnel region 42 is covered with both the impurity diffusion layer 39 and the drain diffusion layer 37d. To the contrary, in the third embodiment, a tunnel region 42 is covered with only the drain diffusion layer 37d. Remaining portions in the third embodiment have substantially the same arrangement as in the above-described second embodiment.

In the above-described first and second embodiments, prior to formation of the polysilicon film 34 or 46 serving as a floating gate, the impurity diffusion layer 39 must be formed in advance in the formation region for the other end portion 34b or 46b in a step different from the step of forming the source and drain diffusion layers 37s and 37d. To the contrary, in the third embodiment, since the drain diffusion layer 37d is formed also below the other end portion 47b, a manufacturing step of forming a diffusion layer below the other end portion 47b need not be added.

Figure 5A:
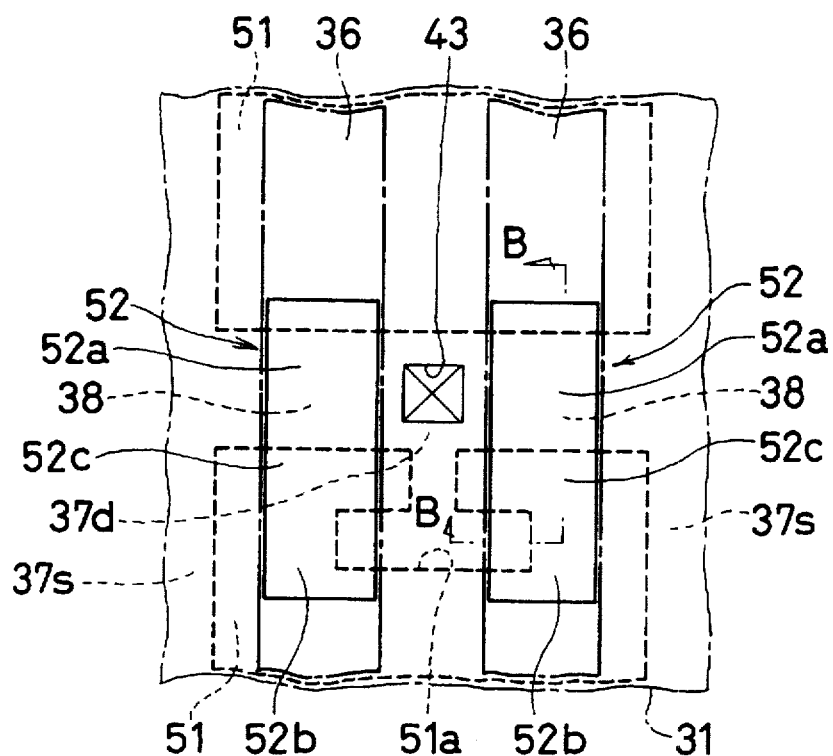
Figure 5B:
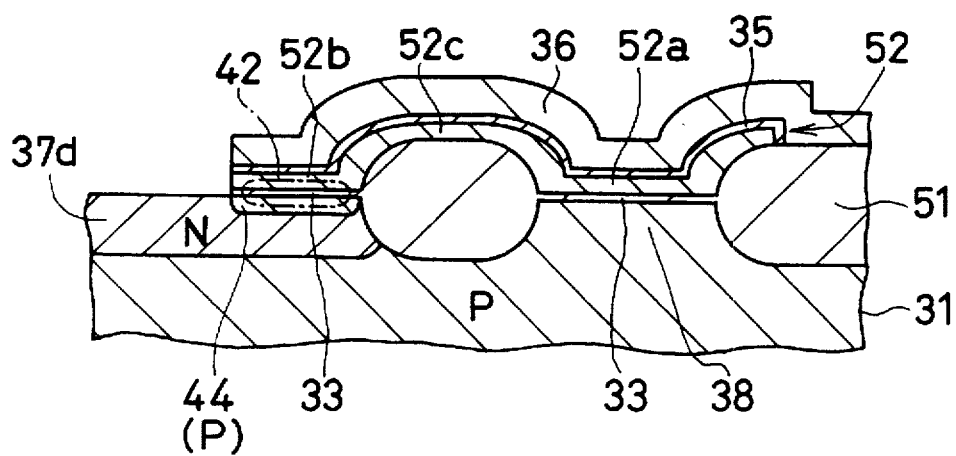

FIGS. 5A and 5B show the fourth embodiment. In the fourth embodiment, a T-shaped notched portion 51a is formed near a contact hole 43 in an SiO$_2$ film 51 forming an isolation region, and the inside of the notched portion 51a also serves as an active region.

A polysilicon film 52 serving as a floating gate is linear. One end portion 52a of the polysilicon film 52 crosses the active region, the other end portion 52b covers the active region near the distal ends of the notched portion 51a, and a middle portion 52c coupling one and the other end portions 52a and 52b to each other is arranged on only the SiO$_2$ film 51.

Remaining portions in the fourth embodiment have substantially the same arrangement as in the above-described third embodiment. In the fourth embodiment, as is apparent from FIG. 5A, a tunnel region 42 is surrounded by the SiO$_2$ film 51 from three directions. For this reason, the area, etched in patterning the polysilicon film 52, of the active region around the tunnel region 42 is small, an Si substrate 31 in the tunnel region 42 has high crystallinity, and the junction leakage current and the like are small.

Although the invention of the present application is applied to an N-channel type flash EEPROM in the above-described first to fourth embodiments, it can be applied to a P-channel type flash EEPROM, and the like. In addition, although the above-described first to fourth embodiments have the structure in which electrons are extracted to the drain diffusion layer 37d, the invention of the present application may be applied to a flash EEPROM having a structure in which electrons are extracted to the source diffusion layer 17s, and the like.

In the above-described first and second embodiments, the tunnel region 42 is covered with both the impurity diffusion layer 39 and the drain diffusion layer 37d. Alternatively, the tunnel region 42 may be covered with only the impurity diffusion layer 39 by forming an impurity diffusion layer 39 wider than the other end portion 34b or 46b of the polysilicon film 34 or 46.

In the floating gate type non-volatile semiconductor memory device according to the invention of the present application, even if band to band transition occurs in a tunnel region upon extraction of carriers from a floating gate through a gate insulating film to generate electron-hole pairs, only one kind of the electron-hole pairs flows into one of drain and source diffusion layers, and the other kind thereof stays in a parasitic inversion layer and does not flow into a semiconductor substrate. For this reason, the substrate current can be decreased, and a high voltage used for extraction can be supplied from an internal boost circuit. A high-voltage, large-current external power supply need not be prepared in addition to a normal voltage power supply, resulting in a simple arrangement.

Since, of the electron-hole pairs generated upon band to band transition, carriers which flow into neither of the drain and source diffusion layers accumulate in the parasitic inversion layer and do not flow into the semiconductor substrate, a voltage for extracting carriers from the floating gate through the gate insulating film is effectively applied to the gate insulating film. Accordingly, the extraction efficiency can be improved, and the extraction time can be shortened or the extraction voltage can be decreased.

What is claimed is:

1. A floating gate type non-volatile semiconductor memory device comprising:

a Si substrate having a first conduction type and defining an active region and an isolation region;

a first SiO$_2$ film formed on a surface of the isolation region of the Si substrate;

a second SiO$_2$ film formed as a gate oxide film on a surface of the active region surrounded by the first film formed on the surface of the isolation region of the Si substrate;

a first polysilicon film forming a floating gate which is isolated for each memory cell and formed on the first and second SiO$_2$ films, the first polysilicon film having a predetermined shape, end portions of which cross the active region, a coupling portion for the end portions arranged only on the first SiO$_2$ film;

a third SiO$_2$ film on the polysilicon film forming a capacitor coupling insulating film;

a second polysilicon film on the first and third SiO$_2$ films forming a control gate for memory cells of said memory device;

source and drain diffusion layers of a second conductivity type formed in the active region on both sides of the first and second polysilicon films, the active region below one of the end portions serving as a channel region;

an impurity diffusion layer having a second conductivity type buried in the active region below the other end portion of the first polysilicon film, the overlapping portion of the other end portion with the drain diffusion layer and the impurity diffusion layer serving as a tunnel region;

whereupon a parasitic inversion layer having a first conductivity type is formed below the other end portion of the first polysilicon film, so that electrons are to be extracted from the first polysilicon film to the drain diffusion layer to rewrite data, the parasitic inversion layer does not contact the Si substrate below the parasitic inversion layer because of the presence of the impurity diffusion layer of the second conductivity type formed below the parasitic inversion layer.

2. The device as set forth in claim 1, wherein the drain diffusion layer having a conductivity layer of the second type is formed on both sides of the parasitic inversion layer and the first and second polysilicon films are not formed on the active region between the ends of the first polysilicon film, whereupon the parasitic inversion layer is not present between the end portions and the parasitic inversion layer below the other end portion of the first polysilicon film does not contact the channel region below the one end portion so that the parasitic inversion layer does not contact any portion of the Si substrate.

3. The device as set forth in claim 2, wherein if band to band transition occurs in the tunnel region to generate electron-hole pairs, only the electrons of the electron-hole pairs flow into the drain diffusion layer, the holes accumulate in the parasitic inversion layer and do not flow into the Si substrate, or vice versa depending on conductivity type.

4. The device as set forth in claim 1, wherein said first polysilicon film is formed in substantially a U shape having one and the other end portions and a coupling portion coupling the one and the other end portions.

5. The device as set forth in claim 1, wherein said second polysilicon film has a rectangular notched portion extending from the vicinity of a contact hole in an extending direction of the second polysilicon film and is formed in a third $SiO_2$ film forming an isolation region wherein an inside of the notched portion also serves as an active portion.

6. The device as set forth in claim 1, wherein said polysilicon film serving as a floating gate has substantially an L shape wherein one and the other end portions cross the active region and a corner portion coupling the end portions is arranged only on the third $SiO_2$ film.

7. The device as set forth in claim 6, wherein the other end portion of the polysilicon film slightly projects onto the active region to allow diffusion of an impurity from a portion below an end edge of the other end portion to a portion below the other end portion to form source and drain diffusion layers, whereupon the tunnel region is covered only with the drain diffusion region.

8. The device as set forth in claim 1, wherein said polysilicon film serving as a floating gate is linear, wherein one end portion crosses the active region and the other end portion covers the active region near the distal ends of a notched portion formed near a contact hole in the film forming an isolation region.

* * * * *